United States Patent [19]

Asahina

[11] Patent Number: 5,422,592
[45] Date of Patent: Jun. 6, 1995

[54] INPUT CIRCUIT OF SEMICONDUCTOR INTEGRATED CIRCUIT DEVICE

[75] Inventor: Katsushi Asahina, Itami, Japan

[73] Assignee: Mitsubishi Denki Kabushiki Kaisha, Tokyo, Japan

[21] Appl. No.: 141,048

[22] Filed: Oct. 26, 1993

[30] Foreign Application Priority Data

Nov. 30, 1992 [JP] Japan ................................. 4-319876

[51] Int. Cl.⁶ ..................... H03K 17/16; H03K 19/094
[52] U.S. Cl. ..................................... 327/427; 327/434; 327/306; 326/63
[58] Field of Search ................ 307/584, 575, 577, 579, 307/571, 583, 475, 264, 548

[56] References Cited

U.S. PATENT DOCUMENTS

| | | | |
|---|---|---|---|
| 4,064,405 | 12/1977 | Cricchi et al. | 307/475 |
| 4,473,758 | 9/1984 | Huntington | 307/577 |
| 4,500,802 | 2/1985 | Janutka | 307/571 |
| 4,574,273 | 3/1986 | Atsumi et al. | 307/579 |
| 4,617,479 | 10/1986 | Hartmann et al. | 307/475 |
| 4,712,023 | 12/1987 | Otsuki et al. | 307/475 |
| 4,719,372 | 1/1988 | Chapell et al. | 307/475 |
| 4,767,951 | 8/1988 | Cornish et al. | 307/475 |
| 4,963,771 | 10/1990 | Chang | 307/475 |
| 5,157,281 | 10/1992 | Santin et al. | 307/475 |
| 5,200,653 | 4/1993 | Moloney et al. | 307/475 |
| 5,216,292 | 6/1993 | Imazu et al. | 307/548 |

OTHER PUBLICATIONS

Proceedings of the IEEE 1992 Custom Integrated Circuits Conference, May 1992, Makoto Takahashi, et al., "3.3V-5V Compatible I/O Circuit Without Thick Gate Oxide", 8 pages.

Primary Examiner—Timothy P. Callahan
Assistant Examiner—T. Lam
Attorney, Agent, or Firm—Oblon, Spivak, McClelland, Maier, & Neustadt

[57] ABSTRACT

Reliability related problems such as destruction of the insulation film and shortened operating life of the MOSFET are prevented in a case where the voltage of an input signal is larger than a power source voltage for a semiconductor integrated circuit device. Where the voltage of an input signal which is received at an input signal terminal (3) is larger than a power source voltage $V_{DD1}$, by causing a voltage drop between source-drain of an N channel MOS transistor (Tr4) which has a gate electrode fixed at the power source voltage $V_{DD1}$, the voltage of the input signal is shifted. The shifted voltage is then applied to a gate electrode of an N channel MOS transistor (Tr2). That is, the voltage of the input signal is not directly applied to the gate electrode of the N channel MOS transistor (Tr2). Thus, when the voltage of the input signal is larger than the power source voltage for the semiconductor integrated circuit device, by shifting the voltage of the input signal and thereby preventing application of an excessively large voltage to a gate insulation film, enhanced operation reliability is attained.

21 Claims, 7 Drawing Sheets

INPUT CIRCUIT OF SEMICONDUCTOR INTEGRATED CIRCUIT DEVICE

BACKGROUND OF THE INVENTION

1. Field of the Invention

The present invention relates to an input circuit of a semiconductor integrated circuit device, and more particularly, to a technique for improving the reliability of an input circuit which receives an input voltage which is higher than a power source voltage which is applied to the input circuit.

2. Description of the Prior Art

Figure 5:
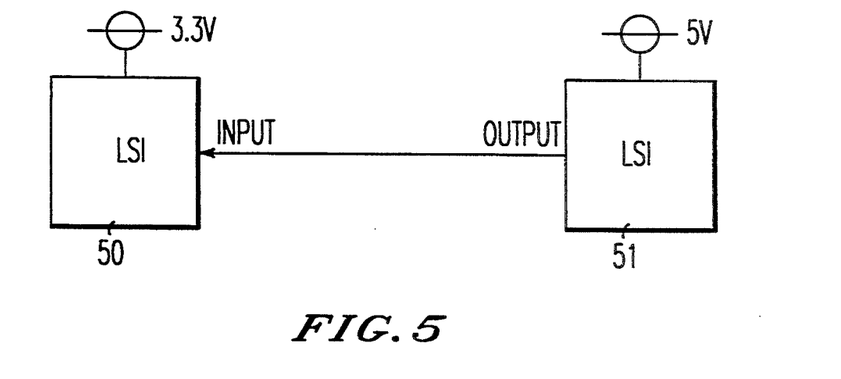
FIG. 5 is a block diagram showing a relation between semiconductor integrated circuit devices.

Due to recent development in the semiconductor technology, a MOS semiconductor integrated circuit device has increasingly high-component-density. As a result, in a MOS semiconductor integrated circuit device of fine structure, the thickness of agate insulation film is extremely thin, 10 nm to 14 nm. Hence, in order to prevent dielectric breakdown of the gate insulation film and to prevent a variation in a threshold voltage of a MOS transistor due to fixed charges in the gate insulation film which are created by hot electrons which are created during the operative state of the MOS transistor and implanted into the gate insulation film, a power source voltage to be applied to the fine MOS semiconductor integrated circuit device is set lower than a power source voltage which is applied to a conventional MOS semiconductor integrated circuit device. In general, an output voltage of a MOS semiconductor integrated circuit device is equal to a potential difference between a power source potential $V_{DD1}$ and a ground potential $V_{SS}$. Although in most cases the voltage of an input signal which is given to an input circuit is equal to a power source voltage for operating the input circuit, in data transmission between semiconductor integrated circuit devices 50 and 51 which operate at different power source voltages (e.g., 3.3 V and 5 V) as shown in FIG. 5, a binary signal which is outputted from the semiconductor integrated circuit device 51 to the semiconductor integrated circuit device 50, for example, is around 0 V (L level) and 5 V (H level) in general. Hence, in applying an output signal of the semiconductor integrated circuit device 51 which operates at a voltage which is higher than a power source voltage for the MOS semiconductor integrated circuit device 50 having fine features, for instance, to the MOS semiconductor integrated circuit device 50 of fine geometry, a voltage $V_{GP}$ which can be applied to a gate electrode of a P channel MOS transistor must be in the range $V_{SS} \leq V_{GP} \leq 2 \times V_{DD1}$ while a voltage $V_{GN}$ which can be applied to agate electrode of an N channel MOS transistor must be in the range $V_{SS} \leq V_{GN} \leq V_{DD1}$.

This is an important consideration fir an input circuit of a semiconductor integrated circuit device. In other words, to obtain an input circuit which is sufficiently reliable, in the case where as an input circuit, an invertor is used which is formed by a P channel MOS transistor having a backgate potential which is fixed to the power source potential $V_{DD1}$ and an N channel MOS transistor having a backgate potential which is fixed to the ground potential $V_{SS}$, for example, the voltage $V_{GP}$ which can be applied to the gate electrode of the P channel MOS transistor and the voltage $V_{GN}$ which can be applied to the gate electrode of the N channel MOS transistor must be in the respective ranges above.

Figure 6:
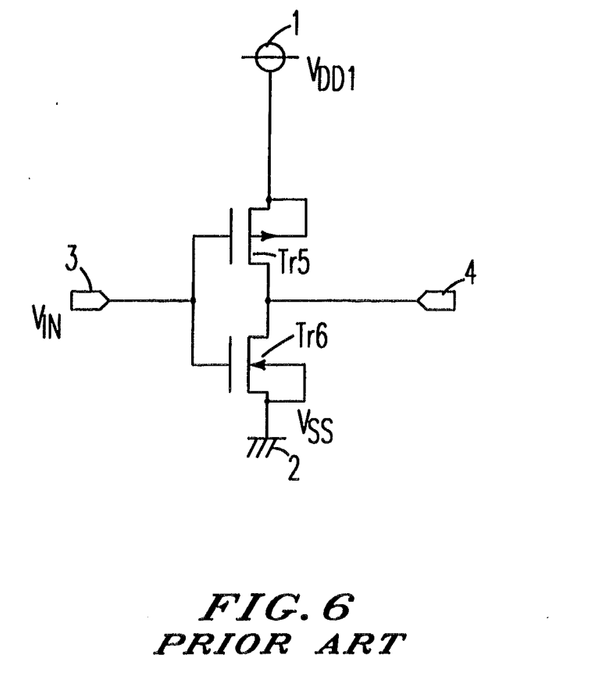
FIG. 6 is a circuitry diagram showing the structure of a conventional input circuit of a semiconductor integrated circuit device.

FIG. 6 is a circuitry diagram of a conventional input circuit of a semiconductor integrated circuit device. In FIG. 6, Tr5 is a P channel MOS transistor and Tr6 is an N channel MOS transistor. Indicated at reference numeral 1 is a power source which serves as a first potential point to which the power source potential $V_{DD1}$ is applied, indicated at reference numeral 2 is a ground which serves as a second potential point to which the ground potential $V_{SS}$ is applied, indicated at reference numeral 3 is an input terminal of the input circuit, and indicated at reference numeral 4 is an output terminal of the input circuit.

Next, operations of the conventional input circuit will be described. A substrate of the P channel MOS transistor Tr5 is connected to the power source 1 so that the backgate potential of the P channel MOS transistor Tr5 is fixed at the power source potential $V_{DD1}$. A substrate of the N channel MOS transistor Tr6 is grounded so that the backgate potential of the N channel MOS transistor Tr6 is fixed at the ground potential $V_{SS}$. The P channel MOS transistor Tr5 and the N channel MOS transistor Tr6 form a CMOS invertor circuit, and therefore, if the voltage $V_{IN}$ of a signal which is applied to the input signal terminal 3 satisfies $V_T \leq V_{IN}$ where a logical threshold voltage of the CMOS invertor circuit is $V_T$, the power source potential $V_{DD1}$ which is available from the power source 1 is outputted at the output terminal 4 of the input circuit. On the other hand, if $V_{IN} \leq V_T$, the ground potential $V_{SS}$ which is supplied from the ground 2 is outputted at the output terminal 4 of the input circuit.

Figure 7:
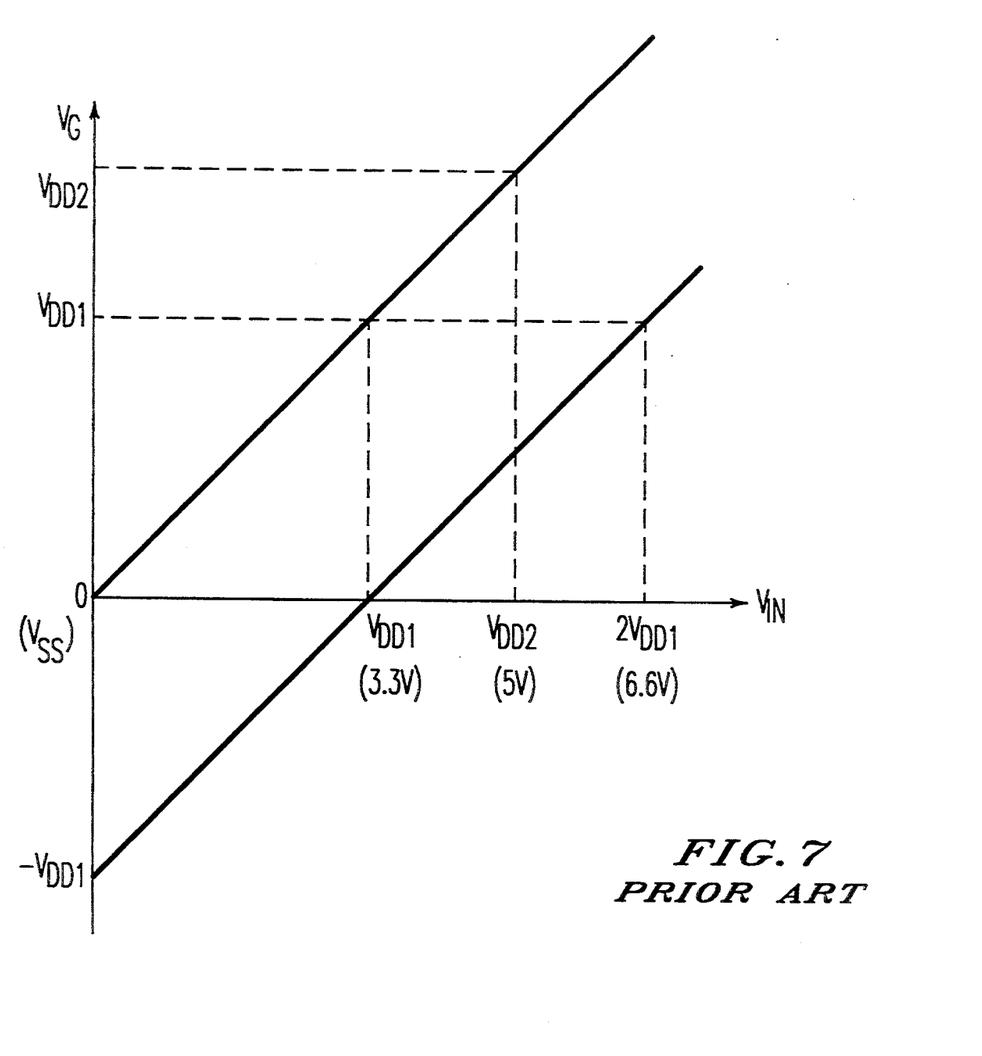
FIG. 7 is a view showing a relation between an input voltage and a voltage which is applied to agate insulation film to thereby explain operations of the input circuit of FIG. 6.

Now, description will be given with reference to FIG. 7 on voltages which will be applied to the gate insulation films of the P channel MOS transistor Tr5 and the N channel MOS transistor Tr6 when the output $V_{IN}$ of the semiconductor into, grated circuit device 51 is received by the input circuit shown in FIG. 6 which is mounted in the semiconductor integrated circuit device 50.

In the P channel MOS transistor Tr5, since the backgate potential is $V_{DD1}$ when the input signal $V_{DD1}$ is at L level, the voltage $V_G$ which is applied to the gate insulation film of the P channel MOS transistor Tr5 is $-V_{DD1}$ with respect to a potential at the source electrode. As the input voltage $V_{IN}$ changes from L level to H level, the gate voltage at the P channel MOS transistor Tr5 increases accordingly. When the input voltage $V_{IN}$ has risen to H level, a voltage applied to the gate insulation film of the P channel MOS transistor Tr5 amounts to 1.7 V.

In the N channel MOS transistor Tr6, when the input signal $V_{IN}$ is at L level, the backgate potential of the N channel MOS transistor Tr6 is $V_{SS}$. Hence, a voltage which is applied to the gate insulation film of the N channel MOS transistor Tr6 is 0 V with respect to a potential at the source electrode. As the input voltage $V_{IN}$ changes from L level to H level, the gate voltage at the N channel MOS transistor Tr6 increases accordingly. When the input voltage $V_{IN}$ has risen to H level, a voltage which is applied to the gate insulation film of the N channel MOS transistor Tr6 amounts to the power source voltage $V_{DD2}$ for the semiconductor integrated circuit device 51 shown in FIG. 5 (i.e., 5 V). Thus, a voltage exceeding $V_{DD1}$ is applied to the gate electrode of the N channel MOS transistor Tr6, degrading the reliability of the input circuit.

Figure 8:
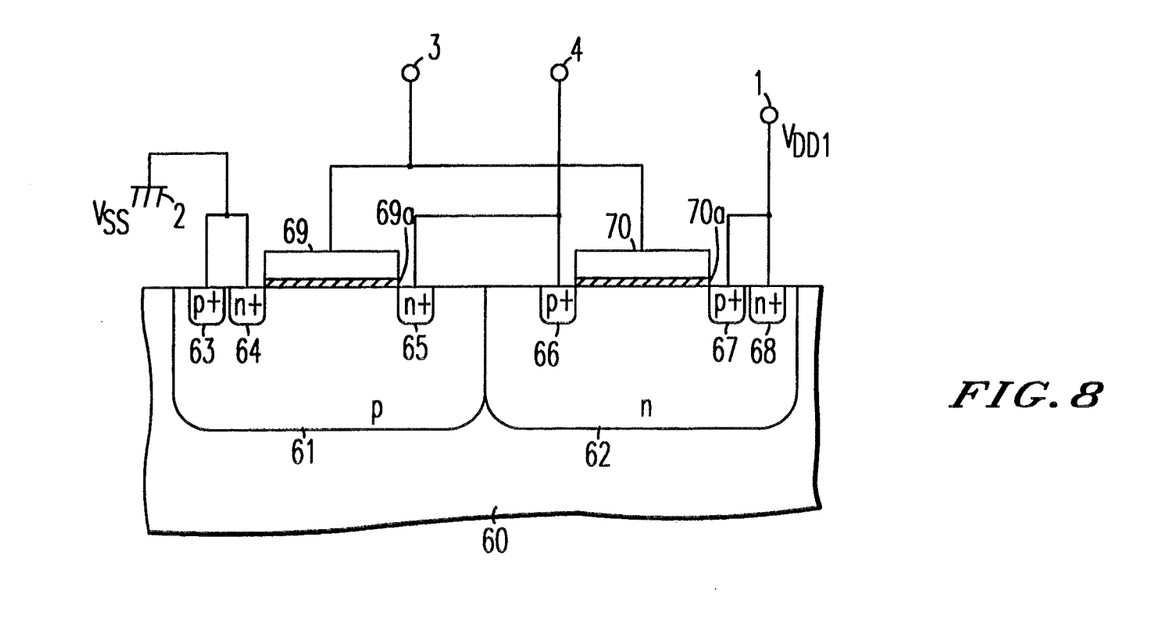
FIG. 8 is a cross sectional view shoving the structure of the input circuit of FIG. 2 formed on a semiconductor substrate.

A relation between a gate electrode and a semiconductor substrate will be explained with reference to FIG. 8 which shows a cross section of an invertor which is formed on a semiconductor substrate. In FIG. 8, indicated at reference numeral 60 is the semiconductor substrate, indicated at reference numeral 61 is a p-well which is formed on the semiconductor substrate 60, indicated at reference numeral 62 is an n-well which is formed on the semiconductor substrate 60, indicated at reference numeral 63 is a p+buried region which is formed on the p-well 61, indicated at reference numeral 64 is a source electrode of an N channel MOS transistor which is formed on the p-well 61, indicated at reference numeral 65 is a drain electrode of the N channel MOS transistor which is formed on the p-well 61, indicated at reference numeral 69 is a gate electrode of the N channel MOS transistor, indicated at reference numeral 69a is a gate insulation film of the gate electrode 69, indicated at reference numeral 66 is a drain electrode of a P channel MOS transistor which is formed on the n-well 62, indicated at reference numeral 67 is a source electrode of the P channel MOS transistor which is formed on the n-well 62, indicated at reference numeral 68 is an n+buried region which is formed on the n-well 62, indicated at reference numeral 70 is a gate electrode of the P channel MOS transistor, and indicated at reference numeral 70a is a gate insulation film of the gate electrode 70. The source electrode 64 of the N channel MOS transistor and the p+buried region 63 are grounded to stay at the ground potential $V_{SS}$ so that the backgate potential of the N channel MOS transistor is fixed at $V_{SS}$. On the other hand, the source electrode 67 of the P channel MOS transistor and the buried region 68 are connected to the power source 1 to remain at the power source potential $V_{DD1}$ so that the backgate potential of the P channel MOS transistor is fixed at $V_{DD1}$. The gate electrodes of the N channel MOS transistor and the P channel MOS transistor are connected to the input terminal 3 while the drain electrode 65 of the N channel MOS transistor and the drain electrode 66 of the P channel MOS transistor are connected to the output terminal 4. Hence, a voltage which is applied to the gate insulation films 69a and 70a is equal to a difference between the associated backgate potential and a potential at the input terminal 3.

Since the conventional input circuit of a semiconductor integrated circuit device has such a structure, when the voltage of the input signal $V_{IN}$ is larger than the power source voltage $V_{DD1}$ tier the semiconductor integrated circuit device 50 as shown in FIG. 5, an excessively large voltage is applied to the gate insulation film of the N channel MOS transistor Tr6. This causes various reliability related problems such as destruction of the insulation film and shortened operating life of the MOSFET.

SUMMARY OF THE INVENTION

In a first aspect of the present invention, an input circuit of a semiconductor integrated circuit device for receiving at an input terminal an input signal and outputting at an output terminal an output signal which is in response to the input signal comprises: input voltage shift means including a field-effect transistor in which a potential at a control electrode of the field-effect transistor is fixed, the input voltage shift means receiving the input signal at the input terminal and shifting the voltage of the input signal in the field-effect transistor and outputting the same; and buffer means including an insulated gate field-effect transistor, the buffer means receiving an output of the input voltage shift means at a gate electrode of the insulated gate field-effect transistor, the buffer means outputting a signal which is in response to the input signal at the output terminal.

The input voltage shift means according to the first aspect of the present invention is capable of shifting the voltage of the input signal by use of the field-effect transistor in which a potential at a control electrode is fixed and outputting the shifted voltage. The input voltage shift means is also capable of providing the gate electrode of the insulated gate field-effect transistor of the buffer means with an input signal which has an appropriate potential range.

Hence, according to the first aspect of the present invention, since the input voltage shift means of the input circuit includes a field-effect transistor in which a potential at a control electrode is fixed and is capable of receiving the input signal at the input terminal, shifting the voltage of the input signal in the field-effect transistor and outputting the same, the voltage which is applied to the gate insulation film of the insulated gate field-effect transistor can be changed, making it possible to prevent destruction of the gate insulation film, shortened life of the insulated gate field-effect transistor and etc. Hence, the operating reliability of the input circuit of the semiconductor integrated circuit device is enhanced.

According to a second aspect of the present invention, in the input circuit of the first aspect, the input voltage shift means further includes resistor means having one end connected to a first power source potential which is in the potential range of the input signal, and the field-effect transistor of the input voltage shift means includes a field-effect transistor which has one current electrode connected to another end of the resistor means, other current electrode connected to the input terminal and a control electrode connected to a predetermined source potential which is in the potential range of the input signal.

Preferably, the field-effect transistor includes an insulated gate field-effect transistor.

The resistor means may include other field-effect transistor which has one current electrode connected to the first power source potential and other current electrode and a control electrode connected to the one current electrode of the field-effect transistor.

Further, the other field-effect transistor may include a P channel MOS transistor which has a source electrode connected to the first power source potential and a drain and agate electrodes connected to the one current electrode of the field-effect transistor.

The resistor means may include a resistor which has one end connected to the first power source potential and other end connected to the one current electrode of the field-effect transistor.

As hereinabove described, since the field-effect transistor of the second aspect of the present invention has its control electrode fixed at the second power source potential, it is possible to shift the input signal using the threshold voltage of the field-effect transistor and to output the shifted voltage at the other current electrode of the field-effect transistor.

According to the second aspect of the present invention, as the field-effect transistor of the input voltage shift means, such a field-effect transistor is used which has one current electrode connected to the first power source potential, another current electrode connected to the one current electrode of the field-effect transistor, and a control electrode connected to the second power source potential which is in the potential range of the input signal. The input signal is shifted using the threshold voltage of the field-effect transistor. The second aspect of the present invention is effective in preventing destruction of the gate insulation film, shortened life of the insulated gate field-effect transistor and etc., thereby enhancing the operating reliability of the input circuit of the semiconductor integrated circuit device.

According to a third aspect of the present invention, in the input circuit of the second aspect, the insulated gate field-effect transistor of the buffer means includes a first insulated gate field-effect transistor of a first conductivity type, the first insulated gate field-effect transistor having one current electrode connected to a second power source potential which is different from the first potential, another current electrode connected to the output terminal and a control electrode for receiving the output of the input voltage shift means. The buffer means further includes a second insulated gate field-effect transistor of a second conductivity type, the second insulated gate field-effect transistor having one current electrode connected to the first power source potential, another current electrode connected to the output terminal and a control electrode connected to the input terminal.

In the third aspect of the present invention, the first and the power source potentials may be used as a backgate potential respectively in the first and the second insulated gate field-effect transistors.

Preferably, the first power source potential includes a power source potential which is higher than the second power source potential, the first insulated gate field-effect transistor includes an N channel MOS transistor, and the second insulated gate field-effect transistor includes a P channel MOS transistor.

Alternatively, the first power source potential may include a power source potential which is lower than the second power source potential, the first insulated gate field-effect transistor may include a P channel MOS transistor, the second insulated gate field-effect transistor may include an N channel MOS transistor.

The buffer means according to the third aspect of the present invention receives, at the control electrode of the first insulated gate field-effect transistor of the first conductivity type, the voltage of the binary signal which is received as the input signal and shifted by the input voltage shift means. Since the received binary signal is directly received and processed at the control electrode of the second insulated gate field-effect transistor of the second conductivity type, the binary signal is outputted as a signal which has two potentials, i.e., the first power source potential and the second power source potential.

Thus, according to the third aspect of the present invention, the insulated gate field-effect transistor of the buffer means includes the first insulated gate field-effect transistor of the first conductivity type, which has one current electrode connected to the second power source potential, another current electrode connected to the output terminal and a control electrode for receiving the output of the input voltage shift means, and the second insulated gate field-effect transistor of the second conductivity type, which has one current electrode connected to the first power source potential, another current electrode connected to the output terminal and a control electrode connected to the input terminal. Hence, the binary signal which is received as the input signal is processed at the first and the second insulated gate field-effect transistors and outputted. Thus, by changing the voltage which is applied to the gate insulation films of the insulated gate field-effect transistors, destruction of the gate insulation film, shortened life of the insulated gate field-effect transistor and etc. are prevented and the operating reliability of the input circuit of the semiconductor integrated circuit device is improved.

According to a fourth aspect of the present invention, in the input circuit of the first aspect, the field-effect transistor of the input voltage shift means includes a first field-effect transistor of a first conductivity type which is formed on a semiconductor substrate, the first field-effect transistor having the other current electrode connected to the input terminal and a control electrode connected to the first power source potential, the second power source potential being used as a backgate potential of the first field-effect transistor. The input voltage shift means further includes a second field-effect transistor of a second conductivity type which is formed on the semiconductor substrate, the second field-effect transistor having one current electrode connected to the first power source potential and the other current electrode and a control electrode connected to the one current electrode of the first field-effect transistor, the first power source potential being used as a backgate potential of the second field-effect transistor. The insulated gate field-effect transistor of the buffer means includes a first insulated gate field-effect transistor of the first conductivity type which is formed on the semiconductor substrate, the first insulated gate field-effect transistor having one current electrode connected to the second power source potential, another current electrode connected to the output terminal and a control electrode receiving the output of the input voltage shift means. The buffer means further includes a second insulated gate field-effect transistor of the second conductivity type which is formed on the semiconductor substrate, the second insulated gate field-effect transistor having one current electrode connected to the first power source potential, the other current electrode connected to the output terminal and a control electrode connected to the input terminal. A channel region of the second field-effect transistor and a channel region of the second insulated gate field-effect transistor are not formed in the same semiconductor layer.

Alternatively, in the input circuit of the first aspect, the field-effect transistor of the input voltage shift means includes a first field-effect transistor of a first conductivity type which is formed on a semiconductor substrate, the first field-effect transistor having the other current electrode connected to the input terminal and a control electrode connected to the first power source potential, the second power source potential being used as a backgate potential of the first field-effect transistor. The input voltage shift means further includes a second field-effect transistor of a second conductivity type which is firmed on the semiconductor substrate, the second field-effect transistor having one current electrode connected to the first power source potential and the other current electrode and a control electrode connected to the one current electrode of the first field-effect transistor, the first power source potential being used as a backgate potential of the second field-effect transistor. The insulated gate field-effect transistor of the buffer means includes a first insulated gate field-effect transistor of the first conductivity type which is formed on the semiconductor substrate, the first insulated gate field-effect transistor having one current electrode connected to the second power source potential the, other current electrode connected to the output terminal and a control electrode receiving the output of the input voltage shift means. The buffer means further includes a second insulated gate field-effect transistor of the second conductivity type which is formed on the semiconductor substrate, the second insulated gate field-effect transistor having one current electrode connected to the first power source potential, the other current electrode connected to the output terminal and a control electrode connected to the input terminal. On the semiconductor substrate, wherein a region is firmed which surrounds the second field-effect transistor or the first insulated gate field-effect transistor, the region having a conductivity which is different from that of a semiconductor layer in which the second field-effect transistor and the first insulated gate field-effect transistor are formed.

In the fourth aspect of the present invention, the channel region of the second field-effect transistor and the channel region of the second insulated gate field-effect transistor are not formed in the same semiconductor layer. Hence, even if the potential at the input terminal becomes larger than a sum of the first power source potential and the threshold voltage of the second field-effect transistor and consequently a current is initiated from the one current electrode of the second field-effect transistor, the second insulated gate field-effect transistor will not be affected by the initiated current. Thus, latch-up would not be caused easily.

As described above, in the input circuit according the fourth aspect of the present invention, the input voltage shift means further includes the second field-effect transistor of the first conductivity type which is formed on the semiconductor substrate and the second field-effect transistor has one current electrode connected to the first power source potential and the other current electrode and a control electrode connected to the one current electrode of the first field-effect transistor. The power source potential is used as a backgate potential of the second field-effect transistor. The buffer means further includes a second insulated gate field-effect transistor of the first conductivity type which is formed on the semiconductor substrate and the second insulated gate field-effect transistor has one current electrode connected to the first power source potential, the other current electrode connected to the output terminal and a control electrode connected to the input terminal. In addition, the channel region of the second field-effect transistor and the channel region of the second insulated gate field-effect transistor are not formed in the same semiconductor layer. Hence, without causing latch-up, the binary signal which is received as the input signal is processed at the first and the second insulated gate field-effect transistors and outputted. Thus, by changing the voltage which is applied to the gate insulation films of the insulated gate field-effect transistors, destruction of the gate insulation film, shortened life of the insulated gate field-effect transistor and etc. are prevented and the operating reliability of the input circuit of the semiconductor integrated circuit device is improved.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
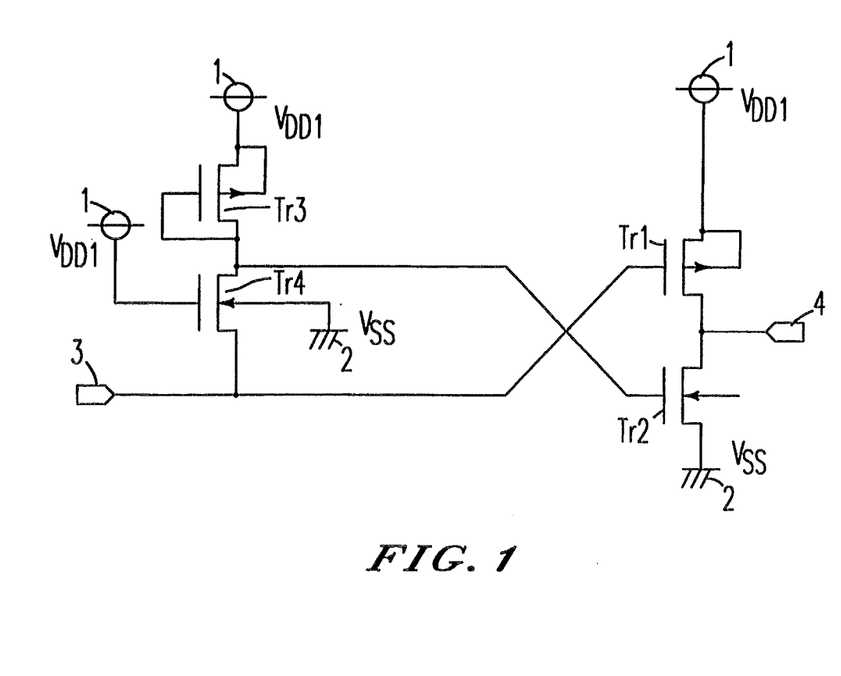
FIG. 1 is a circuitry diagram showing the structure of an input circuit of a semiconductor integrated circuit device according to a preferred embodiment of the present invention.

In the following, a preferred embodiment of the present invention will be described with reference to the drawings. FIG. 1 is a circuitry diagram showing the structure of an input circuit of a semiconductor integrated circuit device according to a preferred embodiment of the present invention. In FIG. 1, a power source is indicated at 1, a ground is indicated at 2, an input terminal of the input circuit is indicated at 3, an output terminal of the input circuit is indicated at 4, P channel MOS transistors are indicated at Tr1 and Tr3, and N channel MOS transistors are indicated at Tr2 and Tr4.

Figure 9:
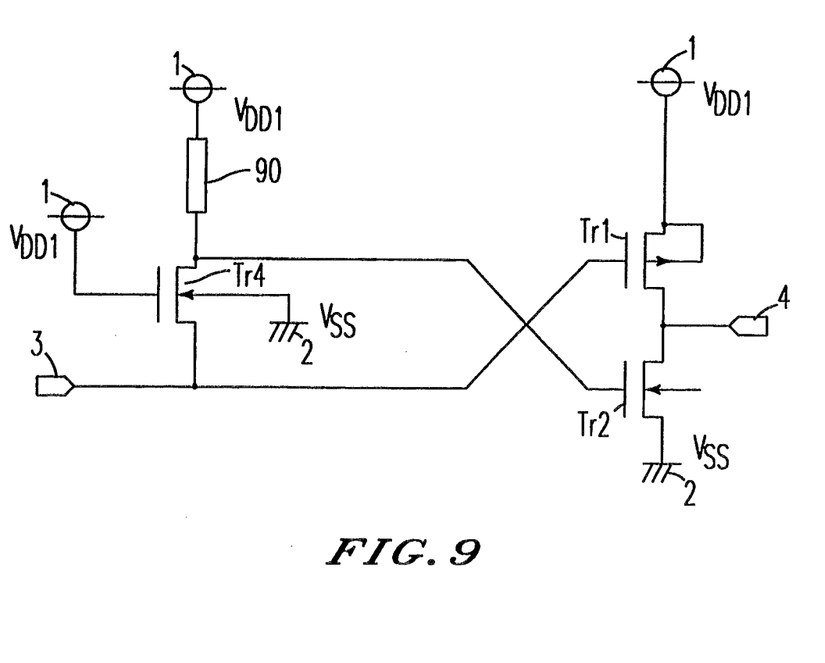
FIG. 9 is a circuitry diagram showing the structure of the input circuit of the semiconductor integrated circuit device according to a modification of the preferred embodiment of the present invention.

Substrates of the P channel MOS transistors Tr1 and Tr3 are connected to a power source potential $V_{DD1}$ while substrates of the N channel MOS transistors Tr2 and Tr4 are connected to the ground potential $V_{SS}$. A resistor 90 may be used instead if transistor Tr3, as shown in FIG. 9. A gate electrode of the N channel MOS transistor Tr4 is connected to the power source potential $V_{DD1}$, a source electrode of the N channel MOS transistor Tr4 is connected to the input terminal 3 of the input circuit, and a drain electrode of the N channel MOS transistor Tr4 is connected to a gate electrode and a drain electrode of the P channel MOS transistor Tr3. A source electrode of the P channel MOS transistor Tr3 is connected to the power source potential $V_{DD1}$ while the gate electrode and the drain electrode of the P channel MOS transistor Tr3 are connected to a gate electrode of the N channel MOS transistor Tr2. A gate electrode of the P channel MOS transistor Tr1 is connected to the input terminal 3 of the input circuit, a source electrode of the P channel MOS transistor Tr1 is connected to the power source potential $V_{DD1}$, and a drain electrode of the P channel MOS transistor Tr1 is connected to the output terminal 4. The gate electrode of the N channel MOS transistor Tr2 is connected to the gate electrode and the drain electrode of the P channel MOS transistor Tr3, a source electrode of the N channel MOS transistor Tr2 is connected to the ground potential $V_{SS}$, while a drain electrode of the N channel MOS transistor Tr2 is connected to the output terminal 4.

Next, operations of the input circuit will be described. Assume that the voltage between the power source potential $V_{DD1}$ and the ground potential $V_{SS}$ is $V_{DD1}$. A case where an input signal shown as $V_{IN}$ is applied to the input terminal 3 of the input circuit will be explained with reference to FIG. 2.

Figure 2:
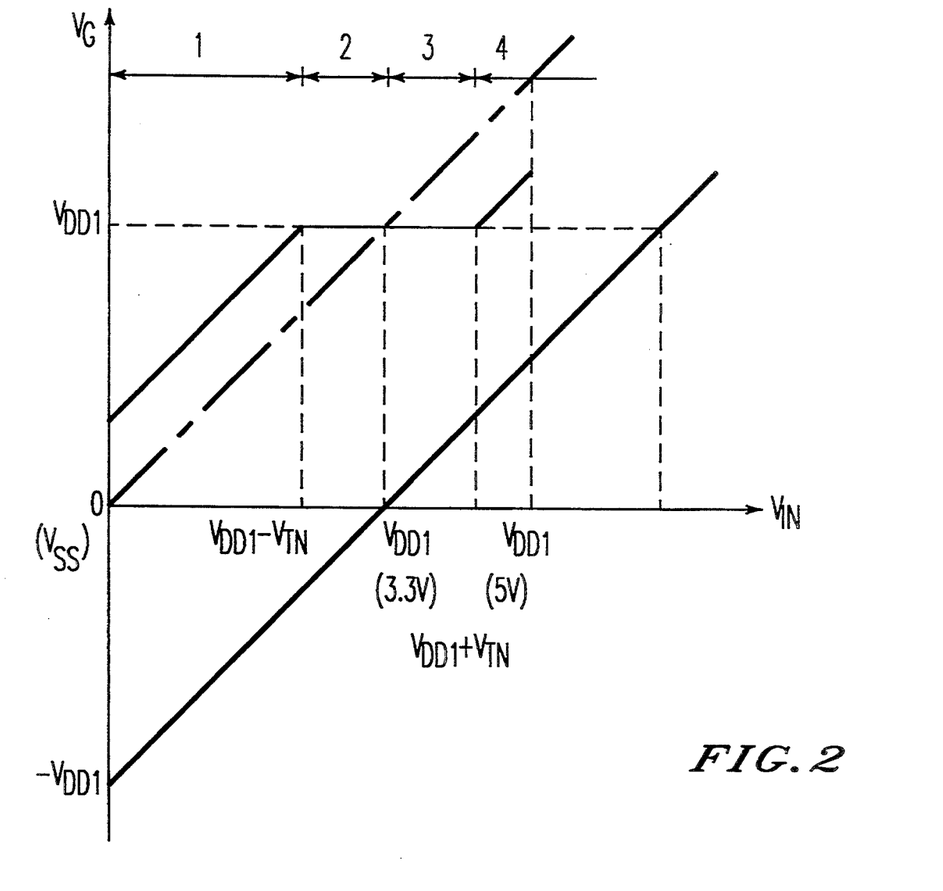
FIG. 2 is a view showing a relation an input voltage and a voltage which is applied to agate insulation film to thereby explain operations of the input circuit of FIG. 1.

Description will be given on what voltage $V_G$ is applied to the gate insulation films of the P channel MOS transistor Tr1 and the N channel MOS transistor Tr2 in a region ① of FIG. 2, i.e., when the input voltage $V_{IN}$ satisfies Eq. 1 below:

$$V_{DD1} - V_{TN}(V_{BS} = -V_{IN}) \geq V_{IN} \quad (1)$$

where $V_{TN}$ ($V_{BS} = -V_{IN}$) is a threshold voltage of when a potential at the substrate of the N channel MOS transistor Tr4 is $V_{BS} = -V_{IN}$.

Under such a state, the N channel MOS transistor Tr4 is conductive. Hence, the gate voltage at the N channel MOS transistor Tr2 is 0 V or extremely close to 0 V, keeping the N channel MOS transistor Tr2 cut off. Since the gate electrode of the P channel MOS transistor Tr1 is connected to the input terminal 3 of the input circuit, a voltage applied between the gate and the source electrodes of the P channel MOS transistor Tr1 is $V_{IN} - V_{DD1}$. This allows the P channel MOS transistor Tr1 to stay strongly conductive, and therefore, a voltage which appears at the output terminal 4 of the input circuit is equal to $V_{DD1}$ or very close to $V_{DD1}$.

Next, what voltage $V_G$ is applied to the gate insulation films in a region ② of FIG. 2, i.e., when the input voltage $V_{IN}$ satisfies Eq. 2 below:

$$V_{DD1} \geq V_{IN} > V_{DD1} - V_{TN}(V_{BS} = -V_{IN}) \quad (2)$$

where $V_{TN}$ ($V_{BS} = -V_{IN}$) is a threshold voltage of when a potential at the substrate of the N channel MOS transistor Tr4 is $V_{BS} = -V_{IN}$.

When such a state is evoked, since the N channel MOS transistor Tr4 is cut off, the gate voltage at the N channel MOS transistor Tr2 is $V_{DD1} + V_{TP}(V_{BS} = 0)$ ($V_{TP}(V_{BS} = 0)$ is a threshold voltage of where a potential at the substrate of the P channel MOS transistor Tr3 $V_{BS}$ is $V_{BS} = 0$). Hence, the N channel MOS transistor Tr2 is in a strong conductive state. Since the gate electrode of the P channel MOS transistor Tr1 is connected to the input terminal 3 of the input circuit, a voltage which is applied between the gate and the source electrodes of the P channel MOS transistor Tr1 is $V_{IN} - V_{DD1}$. This causes the P channel MOS transistor Tr1 to be cut off or weakly conductive. Hence, a voltage which is available at the output terminal 4 of the input circuit is equal to 0 V or very close to 0 V.

Next, what voltage $V_G$ is applied to the gate insulation films in a region ③ of FIG. 2, i.e., when the input voltage $V_{IN}$ satisfies Eq. 3 below:

$$V_{DD1} < V_{IN} \leq V_{DD1} + V_{TN}(V_{BS} = -V_{IN}) \quad (3)$$

When Eq. 3 is satisfied, the N channel MOS transistor Tr4 is cut off, and therefore, the gate voltage at the N channel MOS transistor Tr4 is $V_{DD1} + V_{TP}$. It is to be noted that between the drain and the source electrodes of the N channel MOS transistor Tr4, a voltage opposite to that in the precedent cases is applied.

Next, what voltage $V_G$ is applied to the gate insulation films in a region ④ of FIG. 2, i.e., when the input voltage $V_{IN}$ satisfies Eq. 4 below:

$$V_{IN} > V_{DD1} + V_{TN}(V_{BS} = -V_{IN}) \quad (4)$$

Since the N channel MOS transistor Tr4 is conductive when such a relation is satisfied, the gate voltage the N channel MOS transistor Tr2 is equal to a difference between the input voltage $V_{IN}$ and the threshold voltage $V_{TN}$ of the N channel MOS transistor Tr4. This allows the N channel MOS transistor Tr2 conductive so that the gate voltage at the P channel MOS transistor Tr1 is equal to a difference between the input voltage $V_{IN}$ and the threshold voltage $V_{TN}$ of the N channel MOS transistor Tr4.

Since the substrates of the P channel MOS transistors Tr1 and Tr3 are connected to the power source potential $V_{DD1}$ (i.e., voltage $V_{DD1}$), a voltage which can be applied to the gate electrodes of the P channel MOS transistors Tr1 and Tr3 is in the range $V_{SS} \leq V_{GP} \leq 2 \times V_{DD1}$. The substrates of the N channel MOS transistors Tr2 and Tr4 are connected to the ground potential $V_{SS}$ (i.e., voltage $V_{SS}$), and therefore, a voltage which can be applied to the gate electrodes of the N channel MOS transistors Tr2 and Tr4 is in the range $V_{SS} \leq V_{GN} \leq V_{DD1}$. Hence, since $V_{IN}$ is directly applied to the gate electrode of the gate electrode of the P channel MOS transistor Tr1, the reliability of the gate insulation film of the P channel MOS transistor Tr1 will not be deteriorated as far as $V_{SS} \leq V_{IN} \leq 2 \times V_{DD1}$ holds. As to the gate insulation film of the N channel MOS transistor Tr4, since it is when the N channel MOS transistor Tr4 turns conductive that a voltage $V_{DD1} - V_{IN}$ is applied between the gate insulation films and since the input signal under such a circumstance satisfies $V_{IN} \leq V_{DD1} - V_{TN}$ ($V_{BS} = -V_{IN}$) thereby causing as small voltage as $V_{DD1}$ at most to be applied between the gate insulation films, it can be understood that the reliability of the gate insulation film of the gate insulation film of the N channel MOS transistor Tr4 will not be deteriorated.

Although the foregoing has described that the power source voltage $V_{DD1}$ is larger than the ground potential $V_{SS}$ in the preferred embodiment, the present invention is applicable to where the power source voltage $V_{DD1}$ is smaller than the ground potential $V_{SS}$. If the power source voltage $VDn_l$ is to be smaller than the ground potential $V_{SS}$, an input circuit has to be structured so that the P channel MOS transistors replace N channel MOS transistors and the N channel MOS transistors replace P channel MOS transistors in FIG. 1.

Figure 3:
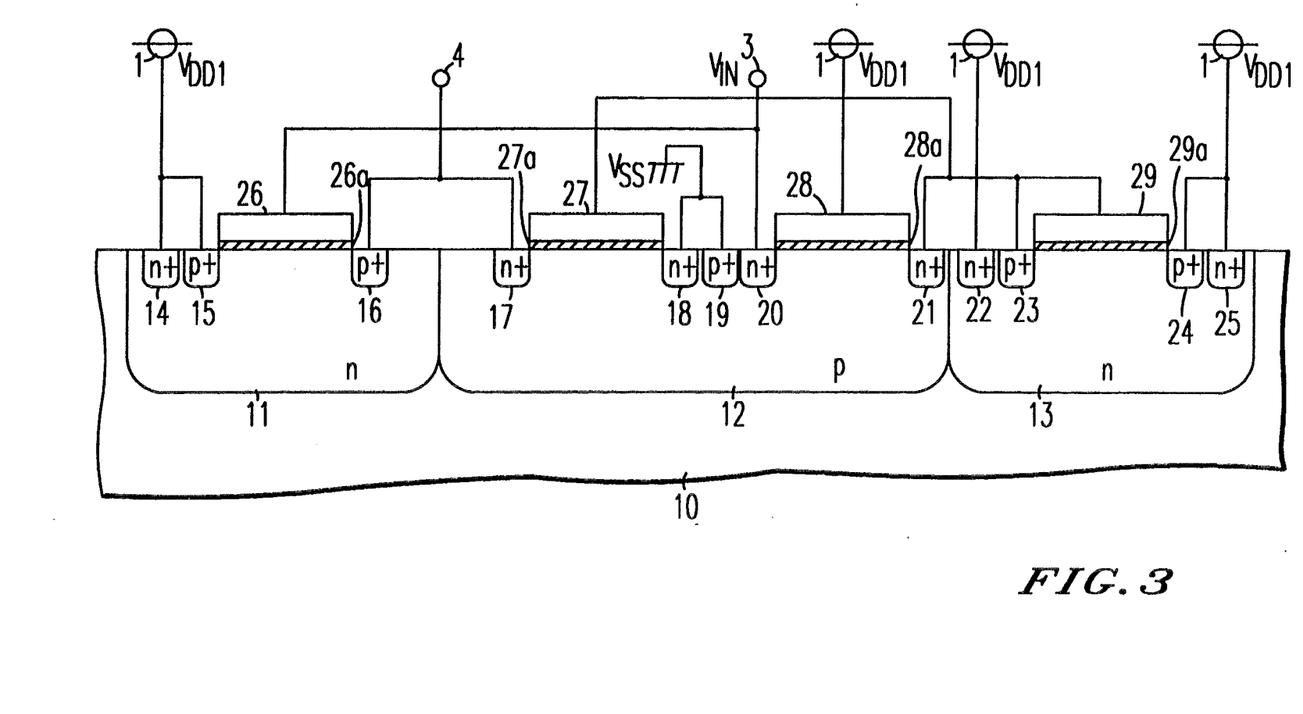
FIGS. 3 and 4 are cross sectional views showing the structure of the input circuit of FIG. 2 firmed on a semiconductor substrate.
Figure 4:
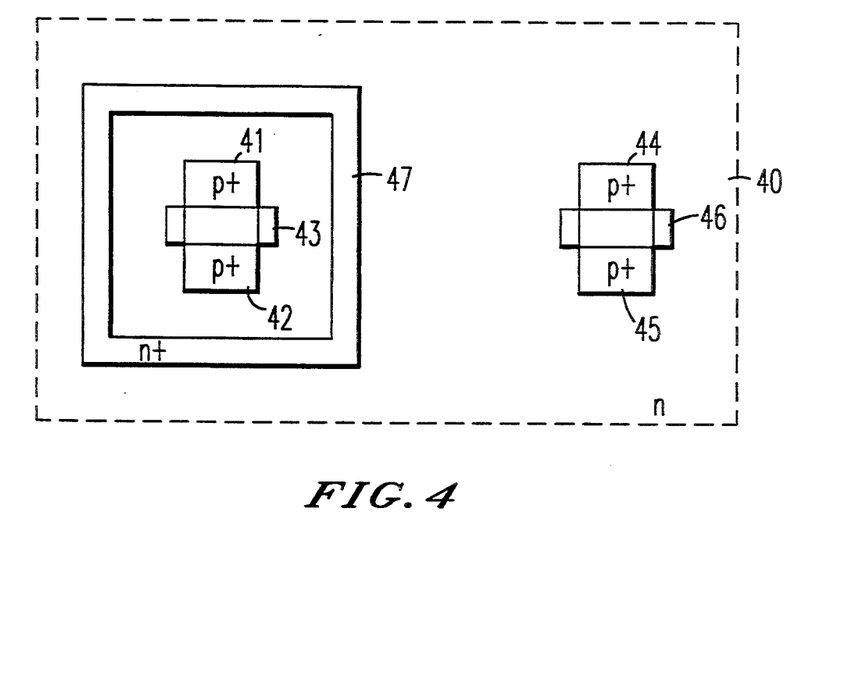

Now, the structure of an input circuit which is formed on a semiconductor substrate will be explained with reference to FIGS. 3 and 4. FIG. 3 is a cross sectional view showing an invertor which is formed on a semiconductor substrate. In FIG. 3, indicated at reference numeral 10 is the semiconductor substrate, indicated at reference numerals 11 and 13 are n-wells which are formed on the semiconductor substrate 10, indicated at reference numeral 12 is a p-well which is formed on the semiconductor substrate 10 between the n-wells 11 and 13, indicated at reference numeral 14 is an n+buried region which is formed on the n-well 11, indicated at reference numeral 15 15 is a source electrode of a P channel MOS transistor (p+region) which is formed on the n-well 11, indicated at reference numeral 16 is a drain electrode of the P channel MOS transistor (p+region) which is formed on the n-well 11, indicated at reference numerals 17 and 21 are drain electrodes of N channel MOS transistors (n+region) which are formed on the p-well 12, indicated at reference numerals 18 and 20 are source electrodes of the N channel MOS transistors (n+region) which are formed on the p-well 12, indicated at reference numeral 19 is a p+buried region which is formed on the p-well 12, indicated at reference numerals 22 and 25 are n+buried regions which are formed on the n-well 13, indicated at reference numeral 23 is a source electrode of a P channel MOS transistor which is formed on the n-well 13, indicated at reference numeral 24 is a drain electrode of the P channel MOS transistor which is formed on the n-well 13, indicated at reference numerals 27 and 28 are gate electrodes of the N channel MOS transistors, indicated at reference numerals 27a and 28a are gate insulation films of the gate electrodes 27 and 28, indicated at reference numerals 26 and 29 are gate electrodes of the P channel MOS transistors, and indicated at reference numerals 26a and 29a are gate insulation films of the gate electrodes 26 and 29.

The P channel MOS transistor which is formed on the n-well 11 corresponds to the P channel MOS transistor Tr1 of FIG. 1, the P channel MOS transistor which is formed on the n-well 13 corresponds to the P channel MOS transistor Tr3 of FIG. 1, the N channel MOS transistor which has the gate electrode 27 corresponds to the N channel MOS transistor Tr2 of FIG. 1, while the N channel MOS transistor which has the gate electrode 28 corresponds to the N channel MOS transistor Tr4 of FIG. 1. The source electrode 18 and the p+buried region 19 are grounded so as to have the ground potential $V_{SS}$ while the backgate potentials of the N channel MOS transistors are fixed at $V_{SS}$. The source electrodes 15 and 23 of the P channel MOS transistors and the buried regions 14 and 25 which are formed on the n-wells 11 and 13 are connected to the power source potential $V_{DD1}$ so that the backgate potentials of the P channel MOS transistors are fixed at $V_{DD1}$.

In addition, the gate electrode 27 of the N channel MOS transistor, the gate electrode 29 of the P channel MOS transistor, and the drain electrode 23 of the N channel MOS transistor and the drain electrode 21 of the P channel MOS transistor are connected to each other. The drain electrodes 16 and 17 of the P channel MOS transistors on the n-well 11 are connected to the output terminal 4. The transistors having the gate electrodes 26 and 27 form an invertor. The gate electrode 28 is fixed at the power source potential $V_{DD1}$ and the source electrode 20 is connected to the input terminal 3 and the gate electrode 26.

If the input signal potential $V_{IN}$ becomes higher than the power source potential $V_{DD1}$ beyond a sum of the threshold voltage $V_{TN}$ of the transistor which has the gate electrode 28 and the power source potential $V_{DD1}$, a current is poured from the drain electrode 23 to the n-well 13. Hence, by separating the n-wells 11 and 13 from each other, it is possible to prevent latch-up due to a change in a potential at the n-well 11.

The preferred embodiment above is related to where the power source potential $V_{DD1}$ is higher than the ground potential $V_{SS}$. However, an input circuit according to the present invention can be also applied to where the power source potential $V_{DD1}$ is lower than the ground potential $V_{SS}$. In such a case, an input circuit has to be structured so that the P channel MOS transistors replace N channel MOS transistors and the N channel MOS transistors replace P channel MOS transistors in FIG. 2.

While the invention has been described in detail, the foregoing description is in all aspects illustrative and not restrictive. It is understood that numerous other modifications and variations can be devised without departing from the scope of the invention.

I claim:

1. An input circuit of a semiconductor integrated circuit device, for receiving an input signal which takes a first potential and a second potential which is higher than said first potential and outputting an output signal of a smaller amplitude than said input signal in response to said input signal, said output signal taking a third potential which is between said first and said second potentials and a fourth potential which is higher than said third potential and between said first and said second potentials, comprising:

an input terminal to which said input signal is supplied;

an output terminal for outputting said output signal;

a first field effect transistor which includes a first current electrode which is connected to said input terminal, a second current electrode and a control electrode which is connected to said fourth potential;

resistor means which includes a first end which is connected to said fourth potential and a second end which is connected to said second current electrode of said first field effect transistor; and, buffer means which comprises a second field effect transistor which includes a third current electrode which is connected to said third potential, fourth current electrode which is connected to said output terminal and a second control electrode which is connected to said second current electrode of said first field effect transistor, said buffer means being connected to said input terminal to buffer said input signal and output said output signal which is in accordance with said input signal, wherein said second field effect transistor comprises an insulated gate field effect transistor; and said buffer means further comprises switching means which is connected to said input terminal, said output terminal and said fourth potential, said switching means supplying said fourth potential to said output terminal under control of said input signal.

2. The input circuit of claim 1, wherein said first field effect transistor comprises an insulated gate field effect transistor.

3. The input circuit of claim 2, wherein said resistor means comprises a third field effect transistor which includes a fifth current electrode which is connected to said fourth potential, a sixth current electrode which is connected to said second current electrode of said first insulated gate field effect transistor and a third control electrode which is connected to said second current electrode of said first insulated gate field effect transistor.

4. The input circuit of claim 1, wherein said resistor means comprises a resistance which includes one end which is connected to said fourth potential and another end which is connected to said second current electrode of first field effect transistor.

5. The input circuit of claim 1, wherein said switching means includes a third field effect transistor which includes a fifth current electrode which is connected to said fourth potential, a sixth current electrode which is connected to said output terminal and a third control electrode which is connected to said input terminal.

6. The input circuit of claim 5, wherein said third field effect transistor comprises an insulated gate field effect transistor, and wherein backgate potentials of said second and said third insulated field effect transistors are said third and said fourth potentials, respectively.

7. An input circuit of a semiconductor integrated circuit device, for receiving an input signal which takes a first potential and a second potential which is higher than said first potential and outputting an output signal of a smaller amplitude than said input signal in response to said input signal, said output signal taking a third potential which is between said first and said second potentials and a fourth potential which is higher than said third potential and between said first and said second potentials, comprising:

an input terminal to which said input signal is supplied;

an output terminal for outputting said output signal;

a first field effect transistor which includes a first current electrode which is connected to said input terminal, a second current electrode, and a first control electrode which is connected to said current electrode and said fourth potential;

resistor means which includes a first end which is connected to said fourth potential and a second end which is connected to said second current electrode of said first field effect transistor;

buffer means which comprises a second field effect transistor which includes a third current electrode which is connected to said output terminal, a fourth current electrode which is connected to said third potential and a second control electrode which is connected to said second current electrode of said first field effect transistor, said buffer means being connected to said input terminal to buffer said input signal and output said output signal which is in accordance with said input signal, wherein said second field effect transistor comprises an insulated gate field effect transistor; and said buffer means further comprises switching means which is connected to said input terminal, said output terminal and said fourth potential, said switching means supplying said fourth potential to said output terminal under control of said input signal.

8. The input circuit of claim 7, wherein said first field effect transistor comprises an insulated gate field effect transistor.

9. The input circuit of claim 7, wherein said resistor means comprises a third field effect transistor which includes a fifth current electrode which is connected to said fourth potential, a sixth current electrode which is connected to said second current electrode of said first insulated gate field effect transistor and a third control electrode which is connected to said second current electrode of said first insulated gate field effect transistor.

10. The input circuit of claim 8, wherein said resistor means comprises a resistance which includes a first end which is connected to said fourth potential and a second end which is connected to said second current electrode of said first field effect transistor.

11. The input circuit of claim 7, wherein said switching means includes a third field effect transistor which includes a fifth current electrode which is connected to said fourth potential, a sixth current electrode which is connected to said output terminal and a control electrode which is connected to said input terminal.

12. The input circuit of claim 11, wherein said third field effect transistor comprises an insulated gate field effect transistor, and wherein backgate potentials of said second and said third insulated field effect transistors are said third and fourth potentials, respectively.

13. An input circuit formed on a semiconductor substrate to receive an input signal which stays at a first potential or a second potential which is higher than said first potential and to output an output signal of a smaller amplitude than said input signal in response to said input signal, said output signal staying at a third potential which between said first and second potentials or at a fourth potential which is higher than said third potential and between said first and said second potentials, comprising:

an input terminal which is formed on said semiconductor substrate, said input signal being supplied to said input terminal;

an output terminal which is formed on said semiconductor substrate, said output terminal outputting said output signal;

a first insulated gate field effect transistor which is formed on said semiconductor substrate, said first insulated gate field effect transistor including a first current electrode which is connected to said output terminal, a second current electrode which is connected to said fourth potential and a first control electrode which is connected to said input terminal;

a second insulated gate field effect transistor which is formed on said semiconductor substrate, said second insulated gate field effect transistor including a third current electrode which is connected to said output terminal, a second control electrode, and a fourth current electrode which is connected to said third potential;

a third insulated gate transistor which is formed on said semiconductor substrate, said third insulated gate transistor including a fifth current electrode which is connected to said fourth potential, a third control electrode which is connected to said control electrode of said second insulated gate transistor and a sixth current electrode which is connected to said control electrode of said second insulated gate transistor, a backgate potential of said third insulated gate transistor being said fourth potential; and a fourth insulated gate transistor which is formed on said semiconductor substrate, said fourth insulated gate transistor including a seventh current electrode which is connected to said control electrode of said second insulated gate transistor, an eighth current electrode which is connected to said input terminal and a fourth control electrode which is connected to said fourth potential, a backgate potential of said fourth insulated gate transistor being said third potential, wherein said first and said third insulated gate transistors are separated from each other by a semiconductor region in which at least said second or said fourth insulated gate transistors are formed.

14. An input circuit formed on a semiconductor substrate to receive an input signal which stays at a first potential or a second potential which is higher than said first potential and to output an output signal of a smaller amplitude than said input signal in response to said input signal, said output signal staying at a third potential which is between said first and said second potentials or at a fourth potential which is higher than said third potential and between said first and said second potentials, comprising:

an input terminal which is formed on said semiconductor substrate, said input signal being supplied to said input terminal;

an output terminal which is formed on said semiconductor substrate, said output terminal outputting said output signal;

a first insulated gate field effect transistor which is formed on said semiconductor substrate, said first insulated gate field effect transistor including a first current electrode which is connected to said output terminal, a first control electrode which is connected to said input terminal and a second current electrode which is connected to said fourth potential;

a second insulated gate field effect transistor which is formed on said semiconductor substrate, said second insulated gate field effect transistor including a third current electrode which is connected to said output terminal, a second control electrode, and a fourth current electrode which is connected to said third potential;

a third insulated gate transistor which is formed on said semiconductor substrate, said third insulated gate transistor including a fifth current electrode which is connected to said fourth potential, a third control electrode which is connected to said second control electrode of said second insulated gate transistor and a sixth current electrode which is connected to said second control electrode of said second insulated gate transistor, a backgate potential of said third insulated gate transistor being said fourth potential; and a fourth insulated gate transistor which is formed on said semiconductor substrate, said fourth insulated gate transistor including a seventh current electrode which is connected to said second control electrode of said second insulated gate transistor, an eighth current electrode which is connected to said input terminal and a control electrode which is connected to said fourth potential, a backgate potential of said fourth insulated gate transistor being said third potential, wherein said first and said third insulated gate transistors are separated from each other by a semiconductor region in which at least said second or said fourth insulated gate transistors are formed.

15. An input circuit of a semiconductor integrated circuit device, for receiving an input signal which takes a first potential and a second potential which is higher than said first potential and outputting an output signal of a smaller amplitude than said input signal in response to said input signal, said output signal taking a third potential which is between said first and said second potentials and a fourth potential which is higher than said third potential and between said first and said second potentials, comprising:

an input terminal to which said input signal is supplied;

an output terminal for outputting said output signal;

a first field effect transistor which includes a first current electrode which is connected to said input terminal, a second current electrode and a control electrode which is connected to said fourth potential;

resistor means which includes a first end which is connected to said fourth potential and a second end which is connected to said second current electrode of said first field effect transistor; and buffer means which comprises a second field effect transistor which includes a third current electrode which is connected to said third potential, a fourth current electrode which is connected to said output terminal and a second control electrode which is connected to said second current electrode of said first field effect transistor, said buffer means being connected to said input terminal to buffer said input signal and output said output signal which is in accordance with said input signal, wherein said first field effect transistor comprises an insulated gate field effect transistor;

said second field effect transistor comprises an insulated gate field effect transistor;

said resistor means comprises a resistance which includes one end which is connected to said fourth potential and another end which is connected to said second current electrode of first field effect transistor; and said buffer means further comprises switching means which is connected to said input terminal, said output terminal and said fourth potential, said switching means supplying said fourth potential to said output terminal under control of said input signal.

16. An input circuit of a semiconductor integrated circuit device, for receiving an input signal which takes a first potential and a second potential which is higher than said first potential and outputting an output signal of a smaller amplitude than said input signal in response to said input signal, said output signal taking a third potential which is between said first and said second potentials and a fourth potential which is higher than said third potential and between said first and said second potentials, comprising:

an input terminal to which said input signal is supplied;

an output terminal for outputting said output signal;

a first field effect transistor which includes a first current electrode which is connected to said input terminal, a second current electrode and a control electrode which is connected to said fourth potential;

resistor means which includes a first end which is connected to said fourth potential and a second end which is connected to said second current electrode of said first field effect transistor; and buffer means which comprises a second field effect transistor which includes a third current electrode which is connected to said third potential and a second control electrode which is connected to said second current electrode of said first field effect transistor, said buffer means being connected to said input terminal to buffer said input signal and output said output signal which is in accordance with said input signal, wherein said first field effect transistor comprises an insulated gate field effect transistor;

said second field effect transistor comprises an insulated gate field effect transistor;

said buffer means further comprises switching means which is connected to said input terminal, said output terminal and said fourth potential, said switching means supplying said fourth potential to said output terminal under control of said input signal; and said switching means includes a third field effect transistor which includes a fourth current electrode which is connected to said fourth potential, a fifth current electrode which is connected to said output terminal and a third control electrode which is connected to said input terminal.

17. An input circuit of a semiconductor integrated circuit device, for receiving an input signal which takes a first potential and a second potential which is higher than said first potential and outputting an output signal of a smaller amplitude than said input signal in response to said input signal, said output signal taking a third potential which is between said first and said second potentials and a fourth potential which is higher than said third potential and between said first and said second potentials, comprising:

an input terminal to which said input signal is supplied;

an output terminal for outputting said output signal;

a first field effect transistor which includes a first current electrode which is connected to said input terminal, a second current electrode and a control electrode which is connected to said fourth potential;

resistor means which includes a first end which is connected to said fourth potential and a second end which is connected to said second current electrode of said first field effect transistor; and buffer means which comprises a second field effect transistor which includes a third current electrode which is connected to said third potential and a second control electrode which is connected to said second current electrode of said first field effect transistor, said buffer means being connected to said input terminal to buffer said input signal and output said output signal which is in accordance with said input signal, wherein said first field effect transistor comprises an insulated gate field effect transistor;

said second field effect transistor comprises an insulated gate field effect transistor;

said buffer means further comprises switching means which is connected to said input terminal, said output terminal and said fourth potential, said switching means supplying said fourth potential to said output terminal under control of said input signal;

said switching means includes a third field effect transistor which includes a fourth current electrode which is connected to said fourth potential, a fifth current electrode which is connected to said output terminal and a third control electrode which is connected to said input terminal;

said third field effect transistor comprises an insulated gate field effect transistor; and backgate potentials of said second and said third insulated field effect transistors are said third and said fourth potentials, respectively.

18. An input circuit of a semiconductor integrated circuit device, for receiving an input signal which takes a first potential and a second potential which is higher than said first potential and outputting an output signal of a smaller amplitude than said input signal in response to said input signal, said output signal taking a third potential which is between said first and said second potentials and a fourth potential which is higher than said third potential and between said first and said second potentials, comprising:

an input terminal to which said input signal is supplied;

an output terminal for outputting said output signal;

a first field effect transistor which includes a first current electrode which is connected to said input terminal, a second current electrode, and a first control electrode which is connected to said fourth potential;

resistor means which includes a first end which is connected to said fourth potential and a second end which is connected to said second current electrode of said first field effect transistor;

buffer means which comprises a second field effect transistor which includes a third current electrode which is connected to said output terminal, a fourth current electrode which is connected to said third potential and a second control electrode which is connected to said second current electrode of said first field effect transistor, said buffer means being connected to said input terminal to buffer said input signal and output said output signal which is in accordance with said input signal, wherein said first field effect transistor comprises an insulated gate field effect transistor;

said second field effect transistor comprises an insulated gate field effect transistor;

said resistor means comprises a third field effect transistor which includes a fifth current electrode which is connected to said fourth potential, a sixth current electrode which is connected to said second current electrode of said first insulated gate field effect transistor and a third control electrode which is connected to said second current electrode of said first insulated gate field effect transistor; and said buffer means further comprises switching means which is connected to said input terminal, said output terminal and said fourth potential, said switching means supplying said fourth potential to said output terminal under control of said input signal.

19. An input circuit of a semiconductor integrated circuit device, for receiving an input signal which takes a first potential and a second potential which is higher than said first potential and outputting an output signal of a smaller amplitude than said input signal in response to said input signal, said output signal taking a third potential which is between said first and said second potentials and a fourth potential which is higher than said third potential and between said first and said second potentials, comprising:

an input terminal to which said input signal is supplied;

an output terminal for outputting said output signal;

a first field effect transistor which includes a first current electrode which is connected to said input terminal, a second current electrode, and a first control electrode which is connected to said fourth potential;

resistor means which includes a first end which is connected to said fourth potential and a second end which is connected to said second current electrode of said first field effect transistor;

buffer means which comprises a second field effect transistor which includes a third current electrode which is connected to said output terminal, a fourth current electrode which is connected to said third potential and a second control electrode which is connected to said second current electrode of said first field effect transistor, said buffer means being connected to said input terminal to buffer said input signal and output said output signal which is in accordance with said input signal, wherein said first field effect transistor comprises an insulated gate field effect transistor;

said second field effect transistor comprises an insulated gate field effect transistor;

said resistor means comprises a resistance which includes a first end which is connected to said fourth potential and a second end which is connected to said second current electrode of said first field effect transistor; and said buffer means further comprises switching means which is connected to said input terminal, said output terminal and said fourth potential, said switching means supplying said fourth potential to said output terminal under control of said input signal.

20. An input circuit of a semiconductor integrated circuit device, for receiving an input signal which takes a first potential and a second potential which is higher than said first potential and outputting an output signal of a smaller amplitude than said input signal in response to said input signal, said output signal taking a third potential which is between said first and said second potentials and a fourth potential which is higher than said third potential and between said first and said second potentials, comprising:

an input terminal to which said input signal is supplied;

an output terminal for outputting said output signal;

a first field effect transistor which includes a first current electrode which is connected to said input terminal, a second current electrode, and a first control electrode which is connected to said fourth potential;

resistor means which includes a first end which is connected to said fourth potential and a second end which is connected to said second current electrode of said first field effect transistor;

buffer means which comprises a second field effect transistor which includes a third current electrode which is connected to said output terminal, a fourth current electrode which is connected to said third potential and a second control electrode which is connected to said second current electrode of said first field effect transistor, said buffer means being connected to said input terminal to buffer said input signal and output said output signal which is in accordance with said input signal, wherein said first field effect transistor comprises an insulated gate field effect transistor;

said second field effect transistor comprises an insulated gate field effect transistor;

said buffer means further comprises switching means which is connected to said input terminal, said output terminal and said fourth potential, said switching means supplying said fourth potential to said output terminal under control of said input signal; and said switching means includes a third field effect transistor which includes a fifth current electrode which is connected to said fourth potential, a sixth current electrode which is connected to said output terminal and a control electrode which is connected to said input terminal.

21. An input circuit of a semiconductor integrated circuit device, for receiving an input signal which takes a first potential and a second potential which is higher than said first potential and outputting an output signal of a smaller amplitude than said input signal in response to said input signal, said output signal taking a third potential which is between said first and said second potentials and a fourth potential which is higher than said third potential and between said first and said second potentials, comprising:

an input terminal to which said input signal is supplied;

an output terminal for outputting said output signal;

a first field effect transistor which includes a first current electrode which is connected to said input terminal, a second current electrode, and a first control electrode which is connected to said fourth potential;

resistor means which includes a first end which is connected to said fourth potential and a second end which is connected to said second current electrode of said first field effect transistor;

buffer means which comprises a second field effect transistor which includes a third current electrode which is connected to said output terminal, a fourth current electrode which is connected to said third potential and a second control electrode which is connected to said second current electrode of said first field effect transistor, said buffer means being connected to said input terminal to buffer said input signal and output said output signal which is in accordance with said input signal, wherein said first field effect transistor comprises an insulated gate field effect transistor;

said second field effect transistor comprises an insulated gate field effect transistor;

said buffer means further comprises switching means which is connected to said input terminal, said output terminal and said fourth potential, said switching means supplying said fourth potential to said output terminal under control of said input signal;

said switching means includes a third field effect transistor which includes a fifth current electrode which is connected to said fourth potential, a sixth current electrode which is connected to said output terminal and a control electrode which is connected to said input terminal;

said third field effect transistor comprises an insulated gate field effect transistor; and backgate potentials of said second and said third insulated field effect transistors are said third and fourth potentials, respectively.

* * * * *